(12) United States Patent
Lasser

(10) Patent No.: US 7,660,166 B2
(45) Date of Patent: Feb. 9, 2010

(54) METHOD OF IMPROVING PROGRAMMING PRECISION IN FLASH MEMORY

(75) Inventor: Menahem Lasser, Kohav Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 19 days.

(21) Appl. No.: 11/836,158

(22) Filed: Aug. 9, 2007

(65) Prior Publication Data

US 2008/0181000 A1    Jul. 31, 2008

Related U.S. Application Data

(60) Provisional application No. 60/887,349, filed on Jan. 31, 2007.

(51) Int. Cl.
*G11C 11/34*    (2006.01)
*G11C 16/04*    (2006.01)
*G11C 7/00*    (2006.01)

(52) U.S. Cl. .............. 365/185.28; 365/185.05; 365/185.12; 365/185.17; 365/185.24; 365/221

(58) Field of Classification Search ............ 365/185.05, 365/185.12, 185.17, 185.24, 221, 185.28
See application file for complete search history.

(56) References Cited

U.S. PATENT DOCUMENTS

| | | | |
|---|---|---|---|
| 5,386,422 A | 1/1995 | Endoh et al. | |
| 5,513,193 A | 4/1996 | Hashimoto | |
| 5,570,315 A | 10/1996 | Tanaka et al. | |
| 5,774,397 A | 6/1998 | Endoh et al. | |
| 5,867,429 A | 2/1999 | Chen et al. | |
| 5,930,167 A | 7/1999 | Lee et al. | |
| 6,046,935 A | 4/2000 | Takeuchi et al. | |
| 6,061,280 A | 5/2000 | Aritome | |
| 6,222,762 B1 | 4/2001 | Guterman et al. | |
| 6,456,528 B1 | 9/2002 | Chen | |
| 6,522,580 B2 | 2/2003 | Chen et al. | |
| 6,781,877 B2 | 8/2004 | Cernea et al. | |
| 6,859,397 B2 | 2/2005 | Lutze et al. | |
| 6,888,758 B1 | 5/2005 | Hemink et al. | |
| 6,917,545 B2 | 7/2005 | Gallo et al. | |
| 6,922,364 B2 | 7/2005 | Kojima | |

(Continued)

FOREIGN PATENT DOCUMENTS

WO    WO 2005/096316    10/2005

(Continued)

OTHER PUBLICATIONS

Brown et al., "Nonvolatile Semiconductor Memory Technology," IEEE Press, Section 1.2, 1998, pp. 9-25.

(Continued)

*Primary Examiner*—Ly D Pham
(74) *Attorney, Agent, or Firm*—Davis Wright Tremaine LLP

(57) ABSTRACT

Data are stored in cells of a flash memory by assigning a first portion of the data to be stored in a first cell and a second portion of the data to be stored in one or more second cells. The first cell is programmed to store the first portion in accordance with the second portion. The second cell(s) is/are programmed to store the second portion. At least a portion of the programming of the first cell is effected before any of the programming of the second cell(s).

18 Claims, 2 Drawing Sheets

U.S. PATENT DOCUMENTS

| | | | |
|---|---|---|---|
| 7,023,736 | B2 | 4/2006 | Cernea et al. |
| 7,046,568 | B2 | 5/2006 | Cernea |
| 7,120,051 | B2 | 10/2006 | Gorobets et al. |
| 7,173,863 | B2 * | 2/2007 | Conley et al. .......... 365/189.05 |
| 7,187,585 | B2 | 3/2007 | Li et al. |
| 7,196,928 | B2 | 3/2007 | Chen |
| 7,196,931 | B2 | 3/2007 | Cernea et al. |
| 7,237,074 | B2 | 6/2007 | Guterman et al. |
| 7,280,427 | B2 * | 10/2007 | Shin ...................... 365/230.05 |
| 7,286,398 | B2 | 10/2007 | Yano et al. |
| 7,400,535 | B2 | 7/2008 | Li |
| 7,443,729 | B2 | 10/2008 | Li et al. |
| 7,495,953 | B2 | 2/2009 | Li |
| 7,506,113 | B2 | 3/2009 | Li |
| 2005/0057965 | A1 | 3/2005 | Cernea et al. |
| 2005/0169057 | A1 | 8/2005 | Shibata et al. |
| 2005/0254309 | A1 | 11/2005 | Kwon et al. |
| 2005/0276101 | A1 | 12/2005 | Chen et al. |
| 2005/0286299 | A1 | 12/2005 | Tomita et al. |
| 2006/0140007 | A1 | 6/2006 | Cernea et al. |
| 2006/0158947 | A1 | 7/2006 | Chan et al. |
| 2007/0061502 | A1 | 3/2007 | Lasser et al. |
| 2007/0189073 | A1 | 8/2007 | Aritome et al. |
| 2007/0206426 | A1 | 9/2007 | Mokhlesi |
| 2007/0291556 | A1 | 12/2007 | Kamei |
| 2008/0019185 | A1 | 1/2008 | Li |
| 2008/0019188 | A1 | 1/2008 | Li |
| 2008/0019193 | A1 | 1/2008 | Li et al. |
| 2008/0158949 | A1 | 7/2008 | Mui et al. |
| 2008/0180996 | A1 | 7/2008 | Lasser |
| 2008/0181000 | A1 * | 7/2008 | Lasser .................. 365/185.03 |
| 2009/0073771 | A1 | 3/2009 | Li |

FOREIGN PATENT DOCUMENTS

| | | |
|---|---|---|
| WO | WO 2008/083132 A2 | 7/2008 |
| WO | WO 2008/083132 A3 | 7/2008 |

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

Eitan et al., "NROM: A Novel Localized Trapping, 2-Bit Nonvolatile Memory Cell," IEEE Electron Device Letters, vol. 21, No. 11, Nov. 2000, pp. 543-545.

Nozaki et al., "A 1-Mb EEPROM With MONOS Memory Cell for Semiconductor Disk Application," IEEE Journal of Solid-State Circuits, vol. 26, No. 4, Apr. 1991, pp. 497-501.

EPO/ISA, "Notification of Transmittal of the International Search Report and the Written Opinion of the International Searching Authority, or the Declaration," corresponding International Patent Application No. PCT/IL2008/000086, mailed on Jun. 23, 2008, 13 pages.

USPTO, "Office Action," mailed in related U.S. Appl. No. 11/836,157 on Apr. 3, 2009, 27 pages.

USPTO, "Notice of Allowance and Fee(s) Due," corresponding in related U.S. Appl. No. 11/856,639 on Aug. 20, 2009, 12 pages.

USPTO, "Notice of Allowance and Fee(s) Due," mailed in related U.S. Appl. No. 11/836,157 on Sep. 23, 2009, 48 pages.

* cited by examiner

METHOD OF IMPROVING PROGRAMMING PRECISION IN FLASH MEMORY

This patent application claims the benefit of U.S. Provisional Patent Application No. 60/887,349, filed Jan. 31, 2007.

This application is related to U.S. patent application Ser. No. 11/836,157 of the same inventors, which is entitled "FLASH MEMORY WITH IMPROVED PROGRAMMING PRECISION" and filed on the same day as the present application. The latter application, also claiming priority from U.S. Provisional Patent Application No. 60/887,349, is incorporated in its entirety as if fully set forth herein.

FIELD AND BACKGROUND OF THE INVENTION

The present invention relates to flash memory storage systems and, more particularly, to a flash memory storage system in which multiple bits are stored per flash memory cell and in which certain disturbance effects are minimized.

FIG. 1, which is identical to FIG. 1 of Chen et al., U.S. Pat. No. 6,522,580, is a block diagram of a typical prior art flash memory device. A memory cell array 1 including a plurality of memory cells M arranged in a rectangular array is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a program operation, and for controlling voltage levels of the bit lines (BL) to promote the programming or to inhibit the programming. (For historical reasons, writing data to a flash memory is called "programming" the flash memory; the terms "writing" and "programming" are used interchangeably herein.) Row control circuit 3 is connected to word lines (WL) to select one of the word lines (WL), to apply read voltages, to apply programming voltages combined with the bit line voltage levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage. Typically, in a NAND flash device, the cells controlled by one word line correspond to one or two pages of the device.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to the column control circuit 2. The external I/O lines are connected to a controller 20.

Command data for controlling the flash memory device are input to a command interface connected to external control lines that are connected with controller 20. The command data informs the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host that initiates commands, such as to store or read data to or from memory array 1, and provides or receives such data, respectively. Controller 20 converts such commands into command signals that can be interpreted and executed by command circuits 7. Controller 20 also typically contains buffer memory for the user data being written to or read from memory array 1. A typical memory system includes one integrated circuit chip 21 that includes controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

Word lines WL are conducting lines that connect the control gates of all cells in a row of cells word lineAs illustrated in FIG. 1, the Word lines WL run horizontally from left to right, with the numerical address of the cells along a word line increasing from left to right. Two cells that are adjacent to each other on a word line are said to be "immediate neighbors" along that word line. The word lines within a block of cells are numbered with the numbers increasing from bottom to top, and the programming order of the word lines is assumed to be from low-numbered word lines to high-numbered word lines. Therefore, a given word line is the immediate successor of another word line if its number is larger by one than the number of the other word line. In such a case, the other word line is the immediate predecessor of the first word line. Bit lines BL are conducting lines that connect all cells in a column of cells and are used for inputting and outputting data to/from the cellsbit line. As illustrated in FIG. 1, the Bit lines BL are assumed to run vertically from bottom to top. A first cell is said to be "above" a second cell if both cells are on the same bit line and the first cell is on a word line that is the immediate successor of the word line of the second cell. In such case the second cell is "below" the first cell. Each cell is located at an intersection of a word line and a bit line, and is said to be "on the word line" and "on the bit line", or alternatively "associated with the word line" and "associated with the bit line".

U.S. Pat. No. 6,781,877 to Cernea et al., that is included by reference for all purposes as if fully set forth herein, discusses a disturbance in programming flash memory cells that results from capacitive coupling between cells. Flash blocks (a block is the smallest chunk for erasing cells in a single operation) are written in units of pages, where a page is the smallest chunk for writing cells in a single operation from the user point of view (and a block contains multiple pages). Typically, the cells associated with a page share a common word line in the array of flash cells, that word line being connected to the control gates of all those cells. In SLC-type flash memories, each cell stores one bit, and the cells of a page are associated exclusively with that page and with no other page. In MLC-type flash memories, each cell stores multiple bits. In most NAND-type flash devices currently in use the different bits of a cell are associated with different user pages (a "user page" is the chunk of data provided by the user of the flash device in a single programming command, and is herein also called a "logical page". In contrast, the combination of all user pages stored in the same cells is herein called a "physical page". A typical user page is currently of a size of 2K bytes, and therefore a corresponding 4-bits-per-cell device has a physical page size of 8 Kbytes. The above sizes ignore some amount of extra cells provided for each page for management purposes, and therefore are only approximations), but there also are MLC devices in which all bits of a multi-bit cell are associated with the same user page. The present invention is applicable to both types of MLC devices. The present invention is also applicable to SLC devices, even though it is most useful for MLC devices that store more than two bits per cell: three bits per cell or four bits per cell or even a higher number of bits per cell. This is because the advantage of the present invention is in increasing the accuracy of programming operations, and such accuracy is most useful when the margin between the threshold voltages of flash cells programmed to different states (to represent different values of stored data) is relatively small, as is the case in MLC devices storing many bits per cell.

In the explanations below we assume that the flash device is of the first MLC type mentioned above. We also assume that a word line corresponds to a single physical page that contains a number of cells that is equal to the number of bits in a logical page. Therefore the word line corresponds to a number of user pages equal to the number of bits per cell in the device. There are flash devices where this is not so and a word line contains multiple (most commonly two) physical pages, each physical page corresponding to multiple user pages. The use of the single-physical-page-per-word line case in the explanations is done only for the sake of simplicity, and the present invention is equally applicable to the multiple-physical-pages-per-word line case.

Flash blocks are typically programmed in sequential order, from the lowest-numbered word line to the highest-numbered word line. Cernea et al. disclose that there is a capacitive coupling between the cells in different word lines, introducing undesired disturbances into the values of threshold voltages attained by the cells. The effect of such coupling is that when programming a cell in word line number N to a relatively high threshold, the threshold voltage of adjacent cells in word line (N-1) are increased. This mainly applies to the cell in word line (N-1) that is directly "below" the currently programmed cell, but is also applicable to a lesser extent to other nearby cells in word line (N-1). See FIG. 2 of Cernea et al. that shows an example of capacitive coupling from a given cell affecting three cells in the word line below the cell.

As the programming of word line N occurs after the programming of word line (N-1), the cells of word line (N-1) remain with a threshold voltage that is higher than intended, possibly causing errors when reading the data. When a block of flash cells is programmed sequentially from first word line to last word line, the capacitive coupling effect introduces errors into cells of successive wordlins programming the second word line introduces errors into the first word line, programming the third word line introduces errors into the second word line, and so on until programming the last word line introduces errors into the next-to-last word line. The only word line not suffering from the capacitive coupling effect is the last word line, as no other word line of the block is programmed after the last word line.

Even though Cernea et al. discuss only the coupling from a word line to its immediate predecessor word line, the capacitive coupling effect is also known to occur across larger distances between word lines, even though to a much lesser extent. That is—the programming of word line N might introduce disturbances into cells of word line (N-2), and even into cells of more distant word lines. The present invention is equally applicable to such longer distance effects, even though for simplicity the explanations are given in terms of the "immediate neighboring word line" case, which is also the most important effect.

It should be noted that it is not possible to use a counter-measure against capacitive coupling of word lines by programming all cells in all word lines possibly with the exception of cells in the last word line) to threshold voltages that are lower than the desired value by a fixed amount, expecting that when programming the next word line the capacitive effect will increase the threshold voltages and bring the threshold voltages to the desired value. This method cannot work because the effect of the capacitive coupling is not fixed but is dependent on the value programmed into the disturbing cell. A cell programmed to a state of high threshold voltage causes a larger disturbance in its neighbors than a cell programmed to a lower threshold voltage. This data dependency makes it impossible to use a fixed correction to counter the problem.

Cernea et al. propose a solution to the capacitive coupling problem that is based on writing each word line multiple times. A word line is first programmed using somewhat-lower-than-final verify voltages, thus bringing the cells of the word line to lower-than-desired threshold voltages. After the next word line is programmed once, the current word line is programmed again (with the same data) using the final verify voltages, thus making sure all cells end up with their desired threshold voltages. This method creates the following order of operations when filling a block:

a. First programming of first word line.
    b. First programming of second word line.
    c. Second programming of first word line.
    d. First programming of third word line.
    e. Second programming of second word line.

The reasoning behind this method is that the final programming of any word line is done when the cells of the next word line are already almost at their final threshold voltages, and so when the cells of the next word line are programmed again, the effect of their capacitive coupling is small. While the first programming of the next word line does affect the threshold voltages of the cells of the current word line after their first programming, the second programming of the current word line (which occurs after the first programming of the next word line) eliminates the effect and narrows the distributions of the cells' threshold voltages around their desired values.

While the method of Cernea et al. seems to solve the capacitive coupling problem in the sense of ending up with the cells being programmed to their desired values with good accuracy, the method has a serious disadvantage. Programming of flash memory is a rather slow operation (compared to reading). Programming almost all word lines twice causes the effective write time of the flash memory device to approximately double, reducing the effective write performance to approximately half. The situation might get even worse when extending Cernea's method to cases where capacitive coupling has to be taken care of not only between adjacent word lines but also between more distant word lines. This is typically the case when the flash cells store more than two bits per cell, as in such cases the accuracy required for reliable programming is high and even relatively small capacitive effects from more distant word lines cannot be neglected. Extending Cernea's method to such cases might require programming cells even more than twice, making the performance problem even more significant.

While the above explanations deal with NAND-type floating-gate flash memory cells, there are other types of flash memory technologies. For example, in the NROM flash memory technology there is no conductive floating gate but an insulating layer trapping the electric charge. The present invention is equally applicable to all flash memory types, even though the explanations are given in the context of floating-gate technology.

Therefore, it is desirable to provide methods for implementing a flash memory device that is more reliable than prior art flash memory devices in the sense of being less vulnerable to capacitive coupling between word lines, while not sacrificing write performance.

SUMMARY OF THE INVENTION

According to the present invention there is provided a method of storing data, comprising the steps of: (a) providing a flash memory that includes a plurality of cells; (b) assigning a first portion of the data to be stored in a first one of the cells; (c) assigning a second portion of the data to be stored in a second at least one of the cells; (d) programming the first cell to store the first portion of the data in accordance with the second portion of the data; and (e) programming the at least one second cell to store the second portion of the data; wherein at least a portion of the programming of the first cell to store the first portion of the data is effected prior to any of the programming of the at least one second cell to store the second portion of the data.

According to the present invention there is provided a memory comprising: (a) a plurality of flash cells; and (b) circuitry for: (i) programming a first one of the flash cells to store first data, and (ii) programming a second at least one of the flash cells to store second data; wherein the first flash cell is programmed in accordance with the second data and wherein at least a portion of the programming of the first flash cell to store the first data is effected prior to any of the programming of the at least one second cell to store the second data.

According to the present invention there is provided a memory device comprising: (a) a first memory that includes: (i) a plurality of flash cells, and (ii) circuitry for programming the flash cells to store data; and (b) a controller for: (i) providing, to the circuitry, data for storing in respective flash cells, and (ii) instructing the circuitry to modify the programming of a first one of the flash cells to store first data, the modifying being in accordance with second data that are to be provided for storing in a second at least one of the flash cells; wherein the controller is operative to provide the second data to the circuitry only after at least a portion of the programming of the first flash cell to store the first data has been effected.

According to the present invention there is provided a system comprising: (a) a flash memory that includes: (i) a plurality of flash cells, and (ii) circuitry for programing the flash cells to store data; (b) a nonvolatile memory wherein is stored driver code of the flash memory, the driver code including: (i) code for providing, to the circuitry, data for storing in respective flash cells, and (ii) code for instructing the circuitry to modify the programming of a first one of the flash cells to store first data, the modifying being in accordance with second data that are to be provided for storing in a second at least one of the flash cells, wherein the second data are provided to the circuitry only after at least a portion of the programming of the first flash cell to store the first data has been effected; and (c) a processor for executing the code.

According to the present invention there is provided a computer-readable storage medium having computer-readable code embedded thereon, the computer-readable code being driver code for a flash memory device that includes a plurality of flash cells and circuitry for programming the flash cells to store data, the computer-readable code comprising: (a) program code for providing, to the circuitry, data for storing in respective flash cells; and (b) program code for instructing the circuitry to modify the programming of a first one of the flash cells to store first data, the modifying being in accordance with second data that are to be provided for storing in a second at least one of the flash cells; wherein the second data are provided to the circuitry only after at least a portion of the programming of the first flash cell to store the first data has been effected.

The methods of the present invention are methods of storing data in a flash memory that includes a plurality of cells. In the basic method, a first portion of the data is assigned to be stored in a first one of the cells and a second portion of the data is assigned to be stored in a second one or more of the cells. The first cell is programmed to store the first portion of the data in accordance with the second portion of the data. The second cell(s) is/are programmed to store the second portion of the data. At least a portion of the programming of the first cell to store the first portion of the data is effected prior to any programming of the second cell(s) to store the second portion of the data.

Preferably, the programming of the first cell to store the first portion of the data includes setting one or more threshold voltage offsets according to the second portion of the data.

Optionally, all of the programming of the first cell to store the first portion of the data is effected before any of the programming of the second cell(s) to store the second portion of the data.

Preferably, the cells are floating gate cells. Alternatively, the cells are programmed by injecting electrons into respective insulating layers of the cells.

Optionally, the second portion of the data is assigned to be stored in a single second cell.

Preferably, the first cell and the second cell(s) are in respective separate physical pages of the flash memory. More preferably, the physical pages are in separate respective word lines of the flash memory. Still more preferably, the word lines are adjacent, in which case, most preferably, the first cell and the second cell (or one of the second cells) share a common bit line. Alternatively, the word lines are separated by at least one intervening word line.

Alternatively, the physical pages are in a common word line of the flash memory. The first cell and the second cell (or one of the second cells) may be either adjacent or separated by at least one intervening cell.

Preferably, the first cell is programmed to a threshold voltage that is less than a nominal threshold voltage for storing the first portion of the data by an offset that depends on the second portion of the data. Most preferably, the offset also depends on the first portion of the data.

The scope of the present invention also includes a memory that includes a plurality of flash cells and circuitry for programming the cells using one of the methods of the present invention. Preferably the memory also includes a cache for storing the two portions of the data prior to the programming.

The scope of the present invention also includes a memory device that includes a first memory and a controller. The first memory includes a plurality of flash cells and circuitry for programming the flash cells to store data. The controller provides the circuitry with data to be stored in respective flash cells and instructs the circuitry how to program those cells using one of the methods of the present invention. Specifically, the controller instructs the circuitry to modify the programming of a first cell to store first data in accordance with second data that are to be provided for storing in a second cell or cells. The controller provides the second data to the circuitry only after at least a portion of the programming of the first cell has been effected. Preferably, the memory device also includes a second memory for storing the first and second data. The second memory could be a cache within the first memory, as in the memory of the present invention, or else a separate memory within the controller.

The scope of the present invention also includes a system that includes a flash memory, a nonvolatile memory wherein is stored driver code of the flash memory, and a processor for executing the driver code. The driver code includes code for emulating the controller of the memory device of the present invention. The scope of the present invention also includes a computer-readable storage medium having embedded thereon such driver code.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
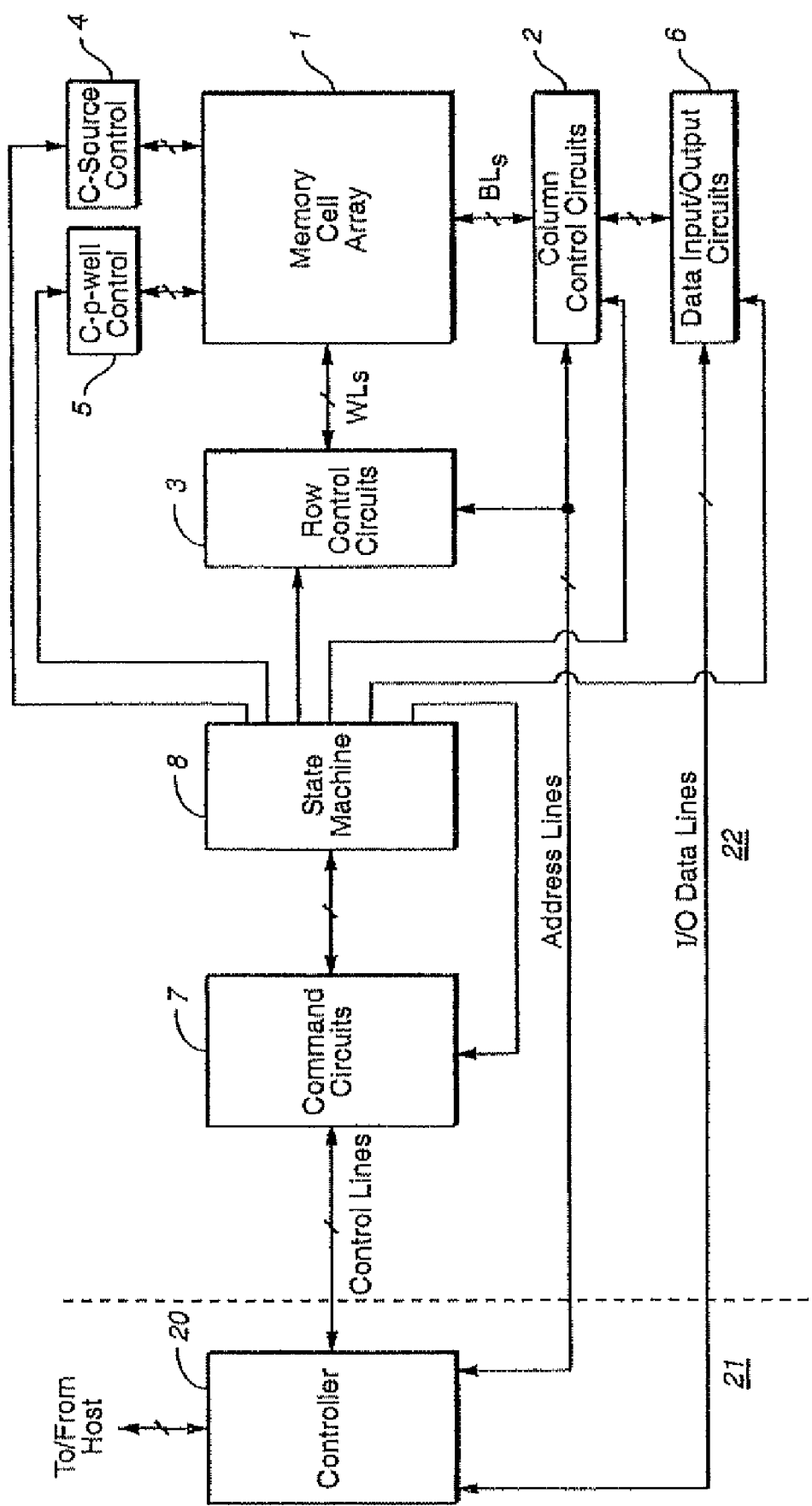
FIG. 1 is a block diagram of a flash memory device.

The principles and operation of a flash memory according to the present invention may be better understood with reference to the drawings and the accompanying description.

The present invention provides a method for eliminating the disturbance caused by capacitive coupling between cells. The method adjusts the programming operation of a given word line according to the data values that are to be programmed into the cells of the next word lines. By taking these data values into account each of the cells of the currently programmed word line is initially set to a threshold voltage that may be lower than its desired threshold voltage, where the deviation from the desired threshold voltage is calculated according to the values that are to be programmed into the cells of the next word lines that disturb that cell. If for example a cell is affected only by its "upper" immediate neighbor and the cells are of the four-bits-per-cell type, then there are 16 different values of threshold voltage to which the upper cell can be programmed. The offset of the initial programming of the currently programmed cell from its desired value is determined according to that upper-cell value. For example, if the upper cell is to be written to the lowest possible value (that is—to stay in its erased state), then no capacitive coupling is expected and the offset may be set to zero (that is—the cell is initially programmed to its final threshold voltage). If the upper cell is to be written to a relatively low value of threshold voltage, the capacitive coupling is expected to be relatively low and the offset will be relatively low, for example 25 milivolts. If the upper cell is to be written to a relatively high value of threshold voltage, the capacitive coupling is expected to be relatively high and the offset will be relatively high, for example 100 milivolts.

It should also be noted that the offset may also depend on the value of the threshold voltage of the currently programmed cell, as it is sometimes found that cells with a higher threshold voltage are more sensitive to capacitive coupling than cells with lower threshold voltage. Therefore, for the case of only one upper cell causing the capacitive coupling, the maximum number of possible different offsets to use is equal to the number of states of a cell, squared. That is—4×4=16 combinations for two-bits per cell devices, 8×8=64 combinations for three-bits-per-cell devices, 16×16=256 combinations for four-bits-per-cell devices, and so on. In practical implementations it is not practical to use such high numbers of different offsets, as the resolution of internal reference voltages within the flash memory device limits the number of different offsets that can be implemented. Therefore the various combinations of {state of current cell, state of upper cell} are mapped to a member of a group of a few offset values (for example 4 values) that most closely matches their capacitive coupling effects. An example of such mapping for a four-bits-per-cell device is:

1. Whenever the currently written cell is in one of the lowest four states, or whenever the upper cell is in one of the four lowest states—set the offset to zero.
2. Else, if the currently written cell is in one of the next four states, or if the upper cell is in one of the next four states—set the offset to 25 milivolts.
3. Else, if the currently written cell is in one of the next four states, or if the upper cell is in one of the next four states—set the offset to 50 milivolts.
4. Else set the offset to 100 milivolts (this case will be selected when both the currently written cell and the upper cell are in one of the four highest states).

The reason that this method is an effective counter-measure to the capacitive coupling disturbance is that when later the next word line(s) is(are) programmed, a capacitive coupling shift that is approximately equal to the offset will occur. The upward shift and the downward offset approximately cancel each other, resulting in all cells ending up close to their desired threshold voltages.

Similar methods apply to the case in which each cell is affected by more than one cell. Those additional affecting cells (additional to the immediate upper neighbor) can be additional cells on the immediately next word line that are not directly above the current cell (like cells 26 and 28 of FIG. 2 of Cernea et al., with reference to cell 25), or cells that are directly above the current cell but not in the immediately next word line (like cell 27 in FIG. 2 of Cernea et al. with respect to cell 31), or cells that are neither directly on top of the current cell nor in the immediately next word line (like cells 26 and 28 in FIG. 2 of Cernea et al. with respect to cell 31), or a combination of all of the above.

In such cases of multiple cells affecting the present cell the number of combinations of states of the affecting cells is much higher. However we can still construct a mapping from the group of such combinations into a relatively small group of offset values, and apply the method in the same way as described above. Even though the complexity of the mapping rule (the equivalent of the example decision rule presented above) is higher, the mapping rule is simple to implement in hardware by a logic circuit or a table in a memory, while the complexity in implementing the different offsets is the same as in the above simple one-affecting-cell example, assuming the number of different offset values is the same.

Note that the procedure outlined above is performed for each and every cell for each and every word line, except for the last word line, whose programming is not affected by other word lines. The cells in the rightmost and leftmost columns (bit lines) may need special handling as they might lack some affecting cells, but such adaptations are easy to do.

One may wonder how the proposed method can rely on data that is to be written in the next word lines for programming a current word line. One would assume that the data to be written in the next word lines would not be known at the present time. This is indeed true for many flash storage systems, in which each page of data provided by a host to be stored into the storage system is written into a successive page of a flash block as the data page is received by the storage system, gradually filling the block. There is however an important class of flash storage systems in which this is not so. This is the class of systems in which incoming data first are buffered in an input cache and only later copied to their final destination. Examples of such systems and explanations of why they are useful are disclosed in U.S. Pat. No. 5,930,167 to Lee et al. and in US Patent Application Publication No. 2007/0061502 to Lasser et al., both of which are included by reference for all purposes as if fully set forth herein.

In such cached storage systems, when a page of data is copied from the cache and written into its final location, the pages that follow it in time are already known to the flash management system as they already reside in the cache. Therefore when writing a word line of a block as part of the cache flushing process, the data that are to be written in the next word lines are available to the system, and the methods of the present invention can be utilized. It should be noted that while it is true that the methods of the present invention cannot be utilized when writing the data the first time into the cache, the storage area used for caching is typically used in an SLC mode (as recommended by Lee et al. and Lasser et al.) where the capacitive coupling disturbances are of much less importance.

It should be understood that the innovation of the present invention is in the idea of using knowledge of data to be written in next word lines for adjusting the programming of the cells of a current word line. The innovation is not in the mechanism and circuitry required for programming different cells of a word line to different threshold voltages. Techniques for doing this are already well known in the art of flash memories circuitry, as can be seen for example in US Patent Application Publication No. 2005/0169057 to Shibata et al. The methods of the present invention can be implemented within the framework of the flash device of Shibata et al. by adding to each bit line a memory for storing which offset value is to be applied to the cell currently programmed on the bit line. If the number of different offsets is, for example, four, two memory bits are required per bit line. The controlling circuitry loads those bits in parallel to loading the data values to be programmed or after loading the data values to be programmed, but before issuing the command to the programming circuitry to do the actual programming. The content loaded to those bits is determined according to the values to be stored in the next word lines, as explained above in detail. The effect of those bits is to determine the verify voltages to be applied during programming. For a bit line with an offset of zero the verify voltage is set to be equal to the default verify voltage used in analogous prior art flash devices. For a bit line with a non-zero offset the verify voltage is set to be lower than the default prior art value by an amount equal to the offset.

It is therefore seen that by using the methods of the present invention the capacitive coupling disturbances are handled without resorting to multiple programming of word lines, thus not sacrificing programming performance. It should however be noted that each additional offset value used in implementing the present invention requires additional verify operations during programming and therefore also increases programming time. Therefore it is not cost-effective to utilize a large number of offset values as the write time saved by the invention is lost in the additional verify operations. However, when the number of offset values is kept small, there is a net gain of programming time. The maximal number of offset values that is still cost-effective in saving programming time depends on the specific flash device parameters—time of a verify operation, time of a programming pulse, number of programming pulses employed, etc.

The methods of the present invention can be implemented in software or in hardware. More specifically, the calculation of the offset to be applied to each cell during writing according to the data of the next word line(s) can be implemented by executing software code or by electrical circuitry. If the calculation is implemented using software, it may be implemented either by executing software on the host computer that writes the data (for example, within the software device driver supporting the storage device), or by executing firmware within the memory controller that interacts with the host computer and controls the memory media. If the method is implemented in hardware, it may be implemented either in the memory controller or within the memory media. This applies whether the memory controller and the memory media are two separate dies or reside on a common die. All the above configurations and variations are within the scope of the present invention.

The methods of the present invention can be extended to also apply to capacitive coupling between cells associated with the same word line, in the case of multiple physical pages residing on a common word line and programmed at separate times. Some flash memory devices employ an architecture in which two separate physical pages share a word line, typically with all even-numbered cells belonging to a first page (called "the even page") and all odd-numbered cells belonging to a second page (called "the odd page"). An example of such a flash device architecture is disclosed in Chen et al. Chen et al. also disclose the existence of capacitive coupling affecting the even page (which is typically the first one to be written) when programming the odd page (which is typically the second one to be written). Chen et al. propose a counter measure against the resulting disturbance by programming the even page twice, thus suffering from reduced performance similar to Cernea et al.

Applying the methods of the present invention to this case, a cell in the even page initially is programmed to a threshold voltage lower than its desired threshold voltage, where the offset between the two values is set according to the values that are to be programmed into adjacent cells in the corresponding odd page. The adjacent cells in the corresponding odd page are on the same word line as the currently programmed cells. The group of cells of the odd page that are taken into account in the calculation may be just the immediate neighbors from the left and right sides of the affected even cell, or the group may also include more distant cells, if the capacitive coupling is strong enough to justify that.

Referring again to the drawings, in addition to illustrating a typical prior art flash memory device, FIG. 1 also illustrates a device of the present invention in which the present invention is implemented in the circuitry of chip 22, and a device of the present invention in which controller 20 and the circuitry of chip 22 cooperate in implementing the present invention. In the latter case, controller 20 provides, to the circuitry of chip 22, data to be programmed into the word lines of memory cell array 1 along with the threshold voltage offsets to be used for that programming. Also in the latter case, the input buffer could be either a SLC cache in memory cell array 1, as in Lee et al. and in Lasser et al., or a memory such as a RAM in controller 20 itself.

Figure 2:
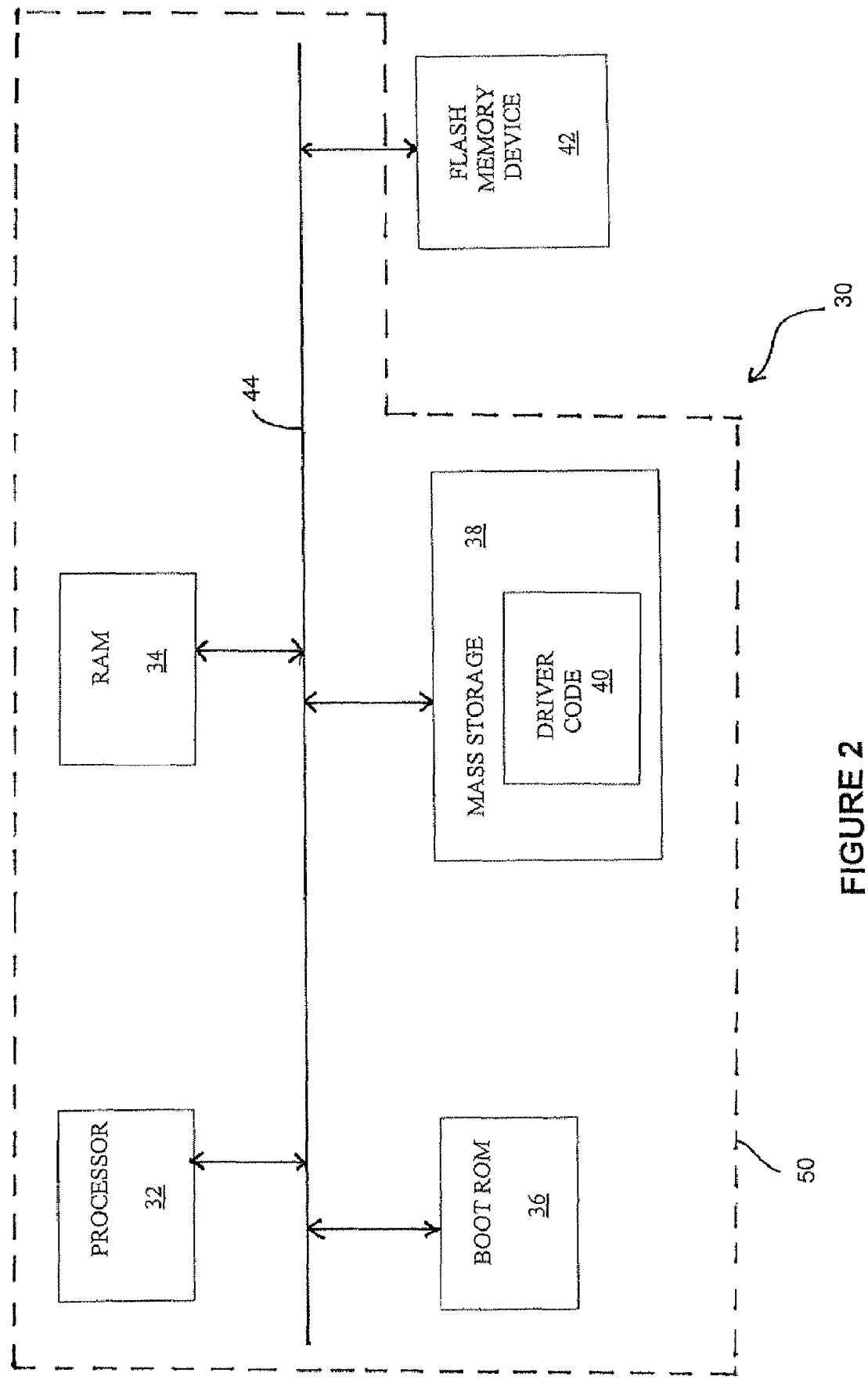
FIG. 2 is a high-level block diagram of a system of the present invention.

FIG. 2 is a high-level block diagram of a system 30 of the present invention. System 30 includes a processor 32 and four memory devices: a RAM 34, a boot ROM 36, a mass storage device (hard disk) 38 and one or more circuit chips 22 of FIG. 1 as a flash memory device 42, all communicating via a common bus 44. Flash memory driver code 40 is stored in mass storage device 38 and is executed by processor 32 to interface between user applications executed by processor 32 and flash memory device 42, and to manage the flash memory of flash memory device 42. In addition to the conventional functionality of such flash management driver code, driver code 40 emulates the functionality of controller 20 of FIG. 2 with respect to implementing the methods of the present invention. Driver code 40 typically is included in operating system code for system 30 but also could be freestanding code.

The components of system 30 other than flash memory device 42 constitute a host 50 of flash memory device 42. Mass storage device 38 is an example of a computer-readable storage medium bearing computer-readable driver code for implementing the present invention. Other examples of such computer-readable storage media include read-only memories such as CDs bearing such code.

While the invention has been described with respect to a limited number of embodiments, it will be appreciated that many variations, modifications and other applications of the invention may be made.

What is claimed is:

1. A method of storing data, comprising the steps of:
   (a) providing a flash memory that includes a plurality of cells;
   (b) assigning a first portion of the data to be stored in a first one of said cells;
   (c) assigning a second portion of the data to be stored in a second at least one of said cells;
   (d) programming said first cell to store said first portion of the data with an adjustment in accordance with said second portion of the data, the adjustment being indicated to the flash memory from outside the flash memory; and
   (e) programming said at least one second cell to store said second portion of the data;
   wherein at least a portion of said programming of said first cell to store said first portion of the data is effected prior to any of said programming of said at least one second cell to store said second portion of the data.

2. The method of claim 1, wherein said programming of said first cell to store said first portion of the data includes setting at least one threshold voltage offset according to said second portion of the data.

3. The method of claim 1, wherein all of said programming of said first cell to store said first portion of the data is effected prior to any of said programming of said at least one second cell to store said second portion of the data.

4. The method of claim 1, wherein said cells are floating gate cells.

5. The method of claim 1, wherein said cells are programmed by injecting electrons into respective insulating layers of said cells.

6. The method of claim 1, wherein said second portion of the data is assigned to be stored in a single said second cell.

7. The method of claim 1, wherein said first cell and said second at least one cell are in respective separate physical pages of said flash memory.

8. The method of claim 7, wherein said physical pages are in separate respective word lines of said flash memory.

9. The method of claim 8, wherein said word lines are adjacent.

10. The method of claim 9, wherein said first cell and one of said at least one second cell share a common bit line.

11. The method of claim 8, wherein said word lines are separated by at least one intervening word line.

12. The method of claim 7, wherein said physical pages are in a common word line of said flash memory.

13. The method of claim 12, wherein said first cell and one of said at least one second cell are adjacent.

14. The method of claim 12, wherein said first cell and one of said at least one second cell are separated by at least one intervening cell.

15. The method of claim 1, wherein said programming of said first cell is to a threshold voltage that is less than a nominal threshold voltage for storing said first portion of the data by an offset that depends on said second portion of the data.

16. The method of claim 15, wherein said offset also depends on said first portion of the data.

17. The method of claim 1, wherein the adjustment being indicated to the flash memory from outside the flash memory is indicated by a controller.

18. The method of claim 1, wherein the adjustment being indicated to the flash memory from outside the flash memory is indicated by a host.

* * * * *